(12) United States Patent
Yamada (10) Patent No.: US 8,488,335 B2
(45) Date of Patent: Jul. 16, 2013

(54) ELECTRO-OPTICAL DEVICE AND ELECTRONIC APPARATUS

(75) Inventor: Katsumi Yamada, Nagano (JP)

(73) Assignee: Japan Display West, Inc., Aichi-Ken (JP)

( * ) Notice: Subject to any disclaimer, the term of this patent is extended or adjusted under 35 U.S.C. 154(b) by 239 days.

(21) Appl. No.: 13/088,676

(22) Filed: Apr. 18, 2011

(65) Prior Publication Data

US 2012/0262898 A1    Oct. 18, 2012

(51) Int. Cl.
*H05K 9/00* (2006.01)

(52) U.S. Cl.
USPC .......................................................... 361/818

(58) Field of Classification Search
None
See application file for complete search history.

(56) References Cited

U.S. PATENT DOCUMENTS

| | | | | |
|---|---|---|---|---|
| 6,160,349 | A * | 12/2000 | Nagai | 315/85 |
| 6,243,274 | B1 * | 6/2001 | Willis | 361/816 |
| 6,703,702 | B2 * | 3/2004 | Inoue et al. | 257/684 |
| 6,972,963 | B1 * | 12/2005 | Chou | 361/760 |
| 7,034,220 | B2 * | 4/2006 | Kim et al. | 361/816 |
| 7,251,140 | B2 * | 7/2007 | Bae et al. | 361/719 |
| 7,282,842 | B2 * | 10/2007 | Kim et al. | 313/46 |
| 7,372,704 | B2 * | 5/2008 | Jeong | 361/719 |
| 7,433,178 | B2 * | 10/2008 | Bang et al. | 361/679.27 |
| 7,545,632 | B2 * | 6/2009 | Cho | 361/679.27 |
| 7,605,525 | B2 * | 10/2009 | Kim | 313/46 |
| 7,660,105 | B2 * | 2/2010 | Hwang | 361/679.27 |
| 7,777,400 | B2 * | 8/2010 | Kim | 313/36 |
| 7,990,512 | B2 * | 8/2011 | Yang | 349/150 |
| 2003/0007341 | A1 * | 1/2003 | Shimamura et al. | 361/816 |
| 2006/0146505 | A1 * | 7/2006 | Kim et al. | 361/752 |
| 2008/0137321 | A1 * | 6/2008 | Park | 361/818 |
| 2008/0170172 | A1 * | 7/2008 | Okuda | 349/59 |
| 2008/0174944 | A1 * | 7/2008 | Yeo | 361/681 |
| 2008/0180931 | A1 * | 7/2008 | Ogawa | 361/816 |
| 2008/0186662 | A1 * | 8/2008 | Lee | 361/681 |
| 2008/0285222 | A1 * | 11/2008 | Yeo et al. | 361/681 |
| 2009/0201660 | A1 * | 8/2009 | Kim | 361/818 |
| 2009/0207350 | A1 * | 8/2009 | Iida | 349/110 |
| 2009/0284946 | A1 * | 11/2009 | Yang et al. | 361/818 |

FOREIGN PATENT DOCUMENTS

JP    2006-284829    10/2006

* cited by examiner

*Primary Examiner* — Lisa Lea Edmonds
*Assistant Examiner* — Xanthia C Cunningham
(74) *Attorney, Agent, or Firm* — K&L Gates LLP (57) ABSTRACT

An electro-optical device includes: a frame that has a conductive portion; an electro-optical panel that is housed in the frame; and an electronic component that is mounted in a mounting area of the electro-optical panel, wherein a shield member having a conductive layer that covers at least a part of the mounting area is brought into contact with the electronic component through an insulating layer, and wherein the conductive layer of the shield member is electrically connected to the conductive portion of the frame.

7 Claims, 4 Drawing Sheets

ELECTRO-OPTICAL DEVICE AND ELECTRONIC APPARATUS

CROSS REFERENCES TO RELATED APPLICATIONS

The present application contains subject matter related to that disclosed in Japanese Priority Patent Application JP 2008-238960 filed in the Japan Patent Office on Sep. 18, 2008, the entire contents of which is hereby incorporated by reference.

BACKGROUND

The present application relates to an electro-optical device that is suitable for displaying various types of information.

Currently, in order to display video on electronic apparatuses such as a cellular phone, a mobile information terminal, and a computer display, electro-optical devices such as liquid crystal devices are widely used.

Such electro-optical devices are configured by interposing an electro-optical material between one pair of substrates. One substrate out of the pair of substrates has a protrusion area that protrudes from one end of the other substrate to the outer side. In the protrusion area, a driver IC that is used for driving the electro-optical material and a wiring substrate such as an FPC (Flexible Printed Circuit) that is electrically connected to the driver IC through a connection terminal are mounted. In the electro-optical device, various signals that are necessary for display are input to the driver IC from the electronic apparatus side through the wiring substrate and the connection terminal. In this signal, since a high-frequency signal used for displaying an image by switching between images at high speed or performing data transmission at high speed is included, electromagnetic wave noise can be easily generated.

In addition, in the electro-optical device, the connection terminal that connects the FPC and the driver IC is frequently exposed to the outside. Accordingly, the exposed connection terminal may easily pick up noise (for example, electromagnetic wave noise or the like) from the outside. In addition, when a high-frequency signal is transmitted between the FPC and the driver IC, noise generated in accordance with the transmission may be emitted from the exposed connection terminal to the outside. When such noise is applied to the connection terminal or is emitted from the connection terminal, there is a concern that a malfunction of the electro-optical device, an electronic apparatus, or the like may occur due to the noise.

Relating to this point, for example, in JP-A-2006-284829, an electro-optical device is disclosed, which does not generate an abnormal operation even when there is external noise such as static electricity.

More specifically, the electro-optical device disclosed in JP-A-2006-284829 has an insulating member, which includes electromagnetic wave absorption material, covering a connection portion between the optical panel and the wiring substrate. The insulating member has dielectric strength that is higher than that of the atmosphere and is disposed so as to cover the substrate-side terminal of the wiring substrate that is exposed to the outside. Accordingly, the substrate-side terminal is prevented from picking up electric noise, and it is understood that the occurrence of an abnormal operation of the electro-optical device due to external noise can be prevented.

SUMMARY

However, in the electro-optical device disclosed in JP-A-2006-284829, the insulating member that includes the electromagnetic wave absorption material (magnetic material) is not connected to a reference electric potential (for example, the earth or the ground). Accordingly, the insulating member absorbs noise, and thereby a large amount of electric charge is accumulated in the insulating member. Therefore, in the electro-optical device, there is a concern that the insulating member may serve as an antenna and externally emit (secondary emission) the absorbed noise.

Thus, it is desirable to provide an electro-optical device capable of effectively eliminating noise generated from the outside or noise generated from a mounted electronic component and an electronic apparatus that uses the electro-optical device.

According to an embodiment, there is provided an electro-optical device including: a frame that has a conductive portion; an electro-optical panel that is housed in the frame; and an electronic component that is mounted in a mounting area of the electro-optical panel. A shield member having a conductive layer that covers at least a part of the mounting area is brought into contact with the electronic component through an insulating layer, and the conductive layer of the shield member is electrically connected to the conductive portion of the frame.

The above-described electro-optical device includes: a frame; an electro-optical panel; and an electronic component. The frame has a conductive portion. The electro-optical panel is housed in the frame. The electronic component is mounted in a mounting area of the electro-optical panel.

To be more specific, in this electro-optical device, a shield member having a conductive layer that covers at least a part of the mounting area is brought into contact with the electronic component through an insulating layer, and the conductive layer of the shield member is electrically connected to the conductive portion of the frame. Here, the reason for covering the electronic component with an insulating layer (for example, tape having an insulating property) of the shield member is that noise is applied to the electronic component in a case where the electronic component is directly bonded to a conductive portion of the shield member.

According to this configuration, since the electronic component is covered with the shield member, electromagnetic waves can be shielded. To be more specific, according to this configuration, noise (for example, including electromagnetic noise) generated by the electronic component is let out to the conductive portion of the frame through the shield member. Accordingly, the noise generated by the electro-optical device can be effectively eliminated. Therefore, a malfunction or the like of the electronic component due to noise can be prevented, whereby adverse effects can be prevented from being applied on the operation of the electro-optical device.

In addition, the shield member serves as a barrier for noise that is generated on the outside, and accordingly, emission of the noise to the electronic component can be prevented. Accordingly, the noise that is generated on the outside of the electro-optical device can be effectively eliminated. Therefore, adverse effects due to noise can be prevented from being applied on the operation of the electro-optical device.

In a preferred example, it is preferable that the conductive layer of the shield member is electrically connected to a reference electric potential. In other words, by connecting the shield member to the ground, in other words, by connecting the conductive layer of the shield member to the reference electric potential, the shield capability of effectively letting out the noise to the frame is further improved. For example, the ground terminal of the driving circuit mounted in the electro-optical device may be connected to the conductive portion of the frame through the shield member, or the conductive portion of the frame may be brought into contact with the casing of the electronic apparatus in which the electro-optical device is built in. In other words, in order to shield the output and the incidence of electromagnetic waves by using the shield member (including the conductive layer), at least a part of the mounting area in which the electronic component is mounted is covered with the shield member, and the conductive layer of the shield member is connected to (in contact with) the frame having the conductive portion so as to be a reference electric potential portion in terms of electricity. In addition, by connecting the shield member to the reference electric potential, accumulation of electric charge in the shield member due to noise is prevented. Accordingly, the noise is prevented from being emitted (secondary emission) from the shield member to the outside.

In addition, in order to completely eliminate the noise, it is preferable that all the electronic components are covered with the shield member.

In a form of the above-described electro-optical device, the electronic components includes a first electronic component and a second electronic component, in the mounting area, the first electronic component, the second electronic component, and a terminal that electrically connects the first electronic component and the second electronic component are arranged, and the shield member covers the first electronic component and the terminal, and the second electronic component on a side which is electrically connected to the terminal.

According to such a form, noise that is generated from the first electronic component and the terminal, and the second electronic component on the side that is electrically connected to the terminal is let out to the frame or the reference electric potential through the shield member. Accordingly, the noise generated by the electro-optical device can be effectively eliminated. Accordingly, the noise generated from the first electronic component and the terminal, and the second electronic component on the side that is electrically connected to the terminal can be prevented from being emitted to the outside. In addition, the shield member serves as a barrier for noise generated on the outside, and the noise can be prevented from being emitted to the first electronic component and the terminal, and the second electronic component on the side that is electrically connected to the terminal. Accordingly, adverse effects due to noise can be prevented from being applied on the operation of the electro-optical device.

In a preferred example, it is preferable that the shield member includes: the conductive layer; the insulating layer that is arranged so as to overlap the conductive layer; and a conductive adhesion layer that is arranged so as to overlap a part of the conductive layer, wherein the insulating layer of the shield member is fixed to the first electronic component with an adhesive or an adhesive tape, and the conductive adhesion layer is electrically connected to the conductive portion of the frame. Alternatively, it is preferable that the shield member includes: the conductive layer; a conductive adhesion layer that is arranged so as to overlap the conductive layer; and the insulating layer that is arranged so as to partially overlap the conductive adhesion layer, wherein a part of the conductive adhesion layer is exposed out of the insulating layer and is electrically connected to the conductive portion of the frame, and the insulating layer is fixed to the first electronic component with an adhesive or an adhesive tape. According to such examples, since the insulating layer of the shield member is fixed to the electronic component with an adhesive or an adhesive tape, the shield member is prevented from being detached from the electronic component.

In another form of the above-described electro-optical device, the first electronic component is a driver IC that controls a display state of the electro-optical panel, the second electronic component is a wiring substrate, and a high-frequency signal is input to the driver IC from a wiring substrate side through the terminal.

According to such a form, when the noise that is generated at the time of transmission of a high-frequency signal is emitted to the outside through the driver IC, the wiring substrate, or the terminal, the emitted noise is let out to the frame or the reference electric potential through the shield member. Accordingly, such noise can be effectively eliminated. Therefore, a malfunction of the driver IC or a detective operation of the electro-optical device due to noise can be prevented.

According to another form of the above-described electro-optical device, at least an area, which overlaps the first electronic component in the plan view, of the shield member has a light shielding property. Accordingly, light (external light) transmitted from the outside of the electro-optical device can be prevented from being incident to the first electronic component (for example, the driver IC), and a malfunction of the first electronic component due to external light can be prevented.

According to another embodiment, there is provided an electronic apparatus including any one of the above-described electro-optical devices as a display unit.

Additional features and advantages are described herein, and will be apparent from the following Detailed Description and the figures.

DETAILED DESCRIPTION

Embodiments of the present application will be described below in detail with reference to the drawings.

First Embodiment

Configuration of Liquid Crystal Device

First, a liquid crystal device 100 as an example of an electro-optical device according to a first embodiment will be described with reference to FIGS. 1 and 2.

Figure 1:
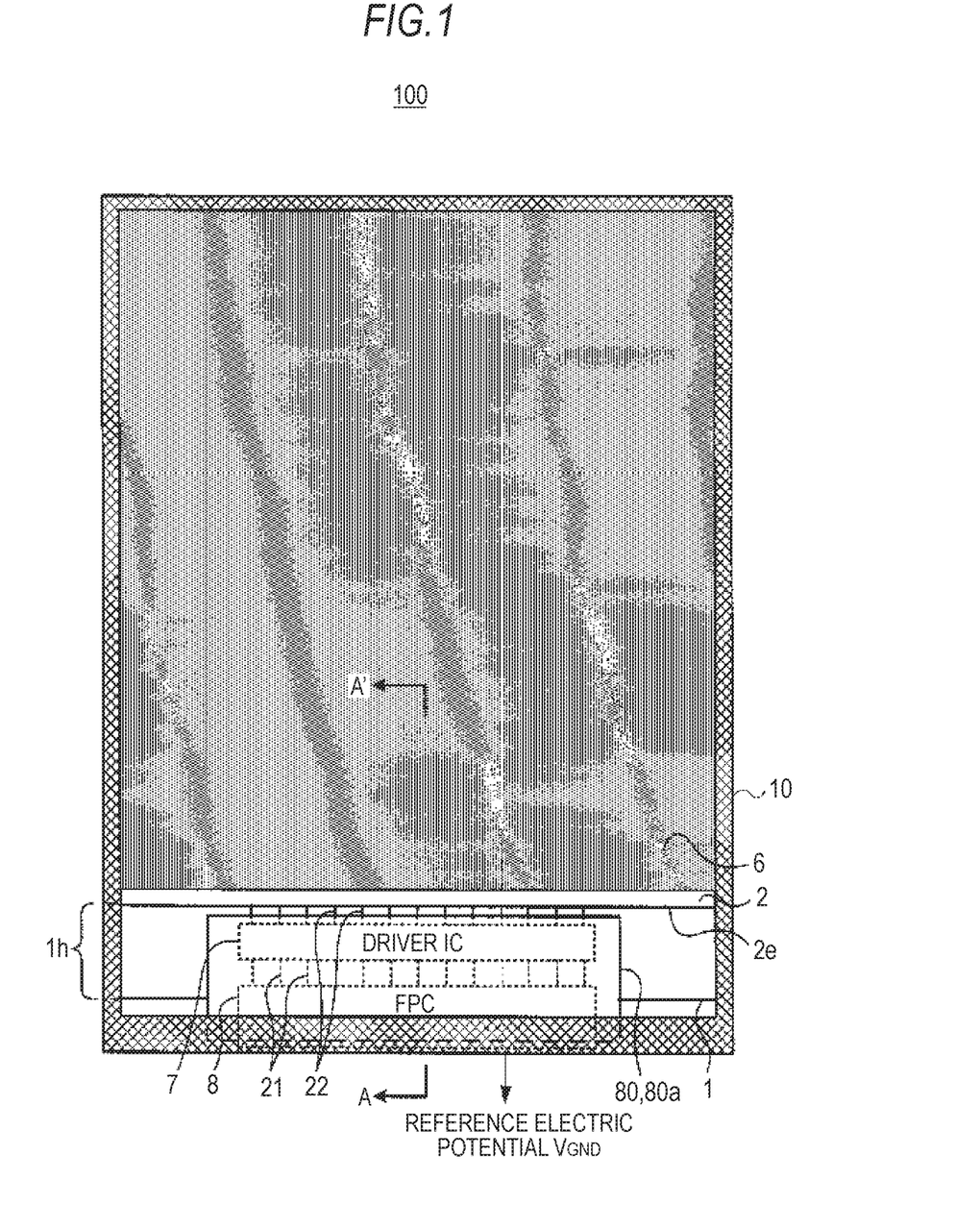
FIG. 1 is a plan view of a liquid crystal device having a noise elimination structure according to a first embodiment.

FIG. 1 is a plan view of the liquid crystal device 100, which is seen on a display side thereof, according to the first embodiment. FIG. 2 is a cross-sectional view of a main portion thereof illustrating the configuration of the liquid crystal device 100, taken along line A-A' shown in FIG. 1. Particularly, FIG. 2 illustrates a noise elimination structure that is configured by a shield member 80 and the like.

The liquid crystal device 100 includes: a liquid crystal display panel 50 as an example of an electro-optical panel; a pair of polarizing plates 5 and 6 that polarize light passing through it; an illumination device 51 that is arranged on a side opposite to the display side of the liquid crystal display panel 50 and illuminates the liquid crystal display panel 50; and a shield member 80.

The liquid crystal display panel 50 is configured by bonding a first substrate 1 and a second substrate 2 through a frame-shaped seal member 3 and interposing a liquid crystal layer 4 as an example of an electro-optical layer therebetween inside an area partitioned by the seal member 3. According to the present application, the configuration of the liquid crystal display panel 50 is not limited to the following configuration, and various known configurations may be employed.

The first substrate 1 has an area (hereinafter referred to as a "mounting area") 1h that projects outward from one end 2e of the second substrate 2. On a face, which is positioned on the second substrate 2 side, of the mounting area 1h, at least one electronic component, for example, a driver IC (Integrated Circuit) 7 and an FPC (Flexible Printed Circuit) 8 as a wiring substrate are mounted, and, additionally, a plurality of connection terminals 21 and the like are mounted. The driver IC 7 has a plurality of input terminals 7a and a plurality of output terminals 7b. Each connection terminal 21 electrically connects each input terminal 7a of the driver IC 7 and the FPC 8.

In addition, a plurality of signal lines 22 are formed from the face, which is positioned on the second substrate 2 side, of the mounting area 1h over the face, which is positioned on the liquid crystal layer 4 side, of the first substrate 1. Each signal line 22 is electrically connected to each output terminal 7b of the driver IC 7. The signal lines 22 include a data line to which data corresponding to display content is supplied, a scanning line to which a scanning signal is supplied, a common wiring to which a reference electric potential (for example, 0 [V]; the ground electric potential or the like) is supplied, and the like.

On a face, which is positioned on the liquid crystal layer 4 side, of the liquid crystal display panel 50, for example, a black matrix, color filters, electrodes, and many other constituent elements, not shown in the figure, are formed in a matrix pattern (lattice shape) or a stripe shape (line shape). In addition, on the inner side of the seal member 3 on the liquid crystal display panel 50, a display region that is used for displaying an image is formed.

The polarizing plate 5 is arranged on a face, which is positioned on a side opposite to the liquid crystal layer 4 side, of the first substrate 1, and the polarizing plate 6 is arranged on a face, which is positioned on a side opposite to the liquid crystal layer 4 side, of the second substrate 2. For example, the transmission axis of the polarizing plate 5 is set as about 90° with respect to the transmission axis of the polarizing plate 6.

The illumination device 51 includes a first support member (frame) 10, a reflective sheet 11, a light guiding plate 12, a light source 13, an optical sheet group, a second support member 17, and light shielding tape 70. Here, the optical sheet group includes well-known optical sheets such as a diffusion sheet 14, a first prism sheet 15, and a second prism sheet 16.

The first support member 10 has a box shape and houses the constituent members of the illumination device 51, the pair of polarizing plates 5 and 6, the liquid crystal display panel 50, and the like in a supported state. In this example, the cross section of the outer peripheral portion, which is positioned on the light source 13 side, of the first support member 10 has a cross section of a letter "π" shape. The first support member 10 is formed from a material such as metal that has conductivity and is electrically connected to $V_{GND}$ (for example, 0 V, a common electric potential of the signal lines 22 or the like, the ground, or the like) at its appropriate position.

The reflective sheet 11 is a sheet-shaped member that reflects light and is arranged on a face, which faces the liquid crystal display panel 50, of the first support member 10.

The light guiding plate 12 is formed from a material having transparency and is arranged on a side, opposite to the first support member 10 side, of the reflective sheet 11 and is arranged at a position facing the reflective sheet 11. The light guiding plate 12 has a role of guiding light L emitted from the light source 13 arranged at a position facing one end face thereof toward the diffusion sheet 14 side. Examples of the light source 13 include a light emitting diode, a cold cathode tube and the like.

The diffusion sheet 14 is arranged one a side, which is opposite to the reflective sheet 11 side, of the light guiding plate 12 and is arranged at a position facing the light guiding plate 12. The diffusion sheet 14 and has a role of diffusing the light L output from the light guiding plate 12 toward the first prism sheet 15.

The first prism sheet 15 is arranged on a face, which is positioned on a side opposite to the light guiding plate 12 side, of the diffusion sheet 14 in an overlapping manner and performs a role of collecting the light L output from the diffusion sheet 14 toward the second prism sheet 16.

The second prism sheet 16 is arranged on a face, which is positioned on a side opposite to the diffusion sheet 14 side, of the first prism sheet 15 in an overlapping manner and performs a role of collecting the light L output from the first prism sheet 15 toward the liquid crystal display panel 50 side. In addition, the extension direction of the ridge line of the prism of the second prism sheet 16, not shown in the figure, can be configured so as to extend in a direction approximately perpendicular to the extension direction of the ridge line of the prism of the first prism sheet 15.

The second support member 17 has a frame shape. The inner peripheral portion (or the inner wall) of the second support member 17 supports the outer peripheral portion (or the outer wall) of the light guiding plate 12 that is not shown in the figure.

The light shielding tape 70 has a frame shape and is arranged at a position (in this example, a face of the mounting area 1h, which is positioned on a side opposite to the second substrate 2 side, of the first substrate 1) that is located on the outer side of the optical sheet group and overlaps the outer peripheral portion of the liquid crystal display panel 50 in the plan view. The light shielding tape 70 has a role of preventing adverse effects on the display quality of the liquid crystal display panel 50 by shielding unnecessary leakage light leaked from the illumination device 51.

The shield member 80 is a member that eliminates noise. The configuration and the arrangement of the shield member 80 will be described later.

Figure 2:
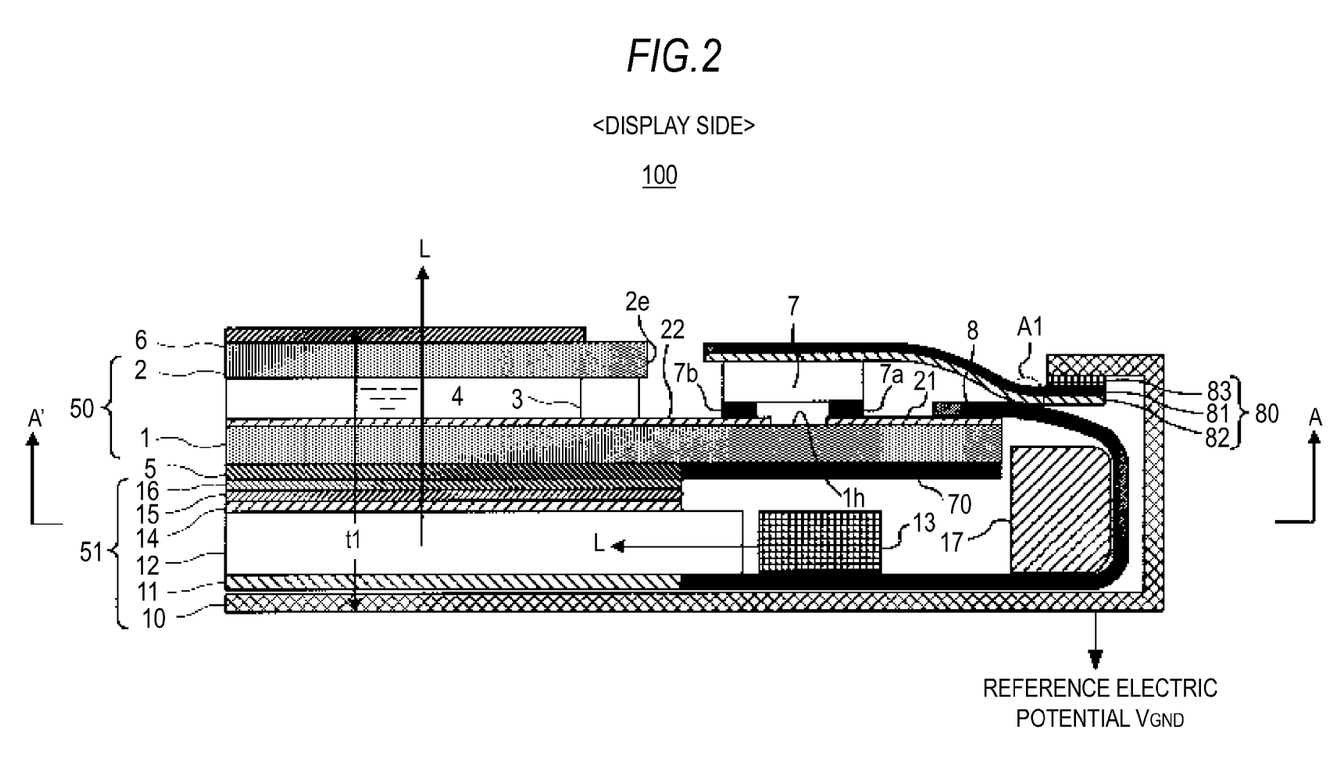
FIG. 2 is a cross-sectional view of a main portion of a liquid crystal device having the noise elimination structure according to the first embodiment.

In the liquid crystal device 100 having the above-described configuration, light L emitted from the light source 13 propagates through the inside of the light guiding plate 12 as denoted by an arrow shown in FIG. 2, and the propagating light L is output from the side, which is positioned on the diffusion sheet 14 side, of the light guiding plate 12. In addition, a part of the light L propagating through the inside the light guiding plate 12 is output from the reflective sheet 11 side and is reflected by the reflective sheet 11, and the light is returned to the inside of the light guiding plate 12. Then, the light L output from the light guiding plate 12 toward the diffusion sheet 14 passes through the optical sheet group and further travels toward the display region of the liquid crystal display panel 50. At this time, the alignment of liquid crystal molecules of the liquid crystal layer 4 in the liquid crystal display panel 50 is controlled such that a desired display image can be visually recognized by an observer.

(Noise Elimination Structure)

Next, a noise elimination structure according to the first embodiment will be described with reference to FIGS. 1 and 2.

First, an example of defects of the liquid crystal device 100 that are caused by noise will be briefly described. For example, when the liquid crystal device 100 is driven, various signals are input from the FPC 8 to the driver IC 7 through the connection terminals 21. In order to display an image by switching between images at high speed or perform data transmission at high speed, a high-frequency signal is included in the above-described signals. When such a high-frequency signal is transmitted, noise (for example, it includes electromagnetic wave noise or the like; the same goes for the following) may be easily emitted from an exposed portion of each connection terminal 21 that electrically connects the driver IC 7 and the FPC 8. In addition, there is a case where noise is emitted from the driver IC 7 itself to the outside thereof, or noise is input to the exposed portion of each connection terminal 21 from the outside of the liquid crystal device 100. When noise is emitted from the driver IC 7 or the exposed portion of each connection terminal 21, there is a concern that it may have adverse effects on the operation of the liquid crystal device 100 or the operation of an electronic apparatus in which the liquid crystal device 100 is mounted. On the other hand, when such noise is input to the exposed portion of each connection terminal 21, there is a concern that it may cause a malfunction of the driver IC 7, and it is difficult for an appropriate signal to be input to the driver IC 7.

Thus, in order to effectively eliminate such noise, according to the embodiment, portions of the liquid crystal device 100 that become generation sources of noise or portions of the liquid crystal device 100 from which noise can be easily picked up, for example, at least some of the electronic components are covered by the shield member 80 in a state of being brought into contact with the shield member 80 through an insulating layer, and the conductive layer of the shield member 80 is electrically connected to a first support member 10 that is electrically connected to the reference electric potential (for example, 0 V, a common electric potential of the signal lines 22 and the like, the ground, or the like) $V_{GND}$. In addition, according to the embodiment, the first support member 10 and the reference electric potential $V_{GND}$ may be electrically connected to each other through a wiring not shown in the figure.

In addition, for example, at least some of the electronic components described above include the driver IC 7 (a first electronic component), the exposed portion of each connection terminal 21, a portion near the end portion (a portion not covered with the first support member 10) of the FPC 8 (a second electronic component) that is positioned on a side electrically connected to the connection terminal 21, and the like.

To be more specific, in the first embodiment, the shield member 80 is configured by a conductive layer 81, an insulating layer 82 that is arranged so as to overlap the conductive layer 81, and a conductive adhesion layer 83 that is arranged so as to overlap a part of the conductive layer 81 that is positioned on a side opposite to the insulating layer 82. Examples of the conductive adhesion layer 83 include an adhesive including conductive particles, for example, ACF (Anisotropic Conductive Film) and the like. The insulating layer 82 of the shield member 80 is fixed to the driver IC 7 with an adhesive or an adhesive tape not shown in the figure, and the conductive adhesion layer 83 is electrically connected to the first support member 10 that is a conductive body electrically connected to the reference electric potential $V_{GND}$. Here, the reason for covering the driver IC 7 through the insulating layer 82 of the shield member 80 is that noise is input to the driver IC 7 in a case where the driver IC 7 is covered by being directly bonded to the conductive layer 81 of the shield member 80.

According to such a configuration, for example, when a high-frequency signal is input from the FPC 8 side to the driver IC 7 side through the connection terminal 21, and thus noise is emitted from the exposed portion of the connection terminal 21, or when noise is emitted from the driver IC 7 itself, the noise is led to the conductive layer 81 through the insulating layer 82 of the shield member 80, is further led to the first support member 10 through the conductive adhesion layer 83, and is finally let out at the reference electric potential $V_{GND}$. Accordingly, the noise that is generated by the liquid crystal device 100 can be effectively eliminated. Therefore, adverse effects due to the noise are prevented from being applied to the operation of the liquid crystal device 100 or the operation of the electronic apparatus in which the liquid crystal device 100 is mounted.

In addition, when noise is emitted from the outside of the liquid crystal device 100 toward the driver IC 7, the exposed portion of the connection terminal 21, the portion of the FPC 8 that is exposed from the first support member 10, and the like, the shield member 80 serves as a barrier, and the noise is prevented from being emitted thereto. The noise is led to the conductive adhesion layer 83 through the conductive layer 81 of the shield member 80 and further is let out at the reference electric potential $V_{GND}$ through the first support member 10. Accordingly, the noise generated outside the liquid crystal device 100 can be effectively eliminated. Therefore, external noise can be prevented from being applied to the driver IC 7, the exposed portion of the connection terminal 21, or the portion of the FPC 8 that is exposed from the first support member 10. As a result, a signal including noise is prevented from being applied to the driver IC 7, and a malfunction and the like of the driver IC 7 due to noise can be prevented.

In addition, since the shield member 80 is electrically connected to the reference electric potential $V_{GND}$, electric charge generated due to noise can be prevented from being accumulated in the shield member 80. Accordingly, the noise can be prevented from being emitted (secondary emission) from the shield member 80.

In a preferred embodiment, in order to sufficiently bring out the operations and the advantages described above, the shield member 80 preferably has a size that can sufficiently cover the driver IC 7, the exposed portion of the connection terminal 21, and the portion of the FPC 8 exposed from the first support member 10.

In addition, according to the first embodiment, one end side of the shield member 80 is electrically connected to the inner face (in this example, the face positioned on the second support member 17 side) of the first support member 10 having a cross section of a letter "π" shape through the conductive adhesion layer 83 in the state in which the area A1 positioned on the one end side is brought into contact with the portion of the FPC 8. Accordingly, when an impact due to a fall or the like is applied to the liquid crystal device 100, the FPC 8 and the first support member 10 can be prevented from being brought into contact with each other or colliding with each other. Therefore, damage of the FPC 8 due to the collision can be prevented.

In addition, in order not to change the external shape of the liquid crystal device 100 due to installation of the shield member 80, it is preferable that the thickness of the shield member 80 does not exceed the thickness t1 of the liquid crystal device 100. Recently, since the liquid crystal device 100 tends to be formed thinner and thinner, it is preferable that the shield member 80 is formed in a thin tape state.

In addition, the one end side of the shield member 80, as described above, is electrically connected to the inner face (in this example, the face positioned on the second support member 17 side) of the first support member 10 having a cross section of a letter "π" shape through the conductive adhesion layer 83. Accordingly, the one end side of the shield member 80 is not exposed to the outside of the first support member 10 so as not to be easily detached. In addition, the thickness of the liquid crystal device 100 positioned on the one end side of the shield member 80 can be prevented from becoming larger than the thickness t1 of the liquid crystal device 100. Therefore, the mounting of the liquid crystal device 100 in the electronic apparatus, which recently has continued to decrease in thickness, can be prevented from being limited due to the installation of the shield member 80.

In addition, it is preferable that at least an area of the conductive layer 81 of the shield member 80 that overlaps the driver IC 7 in the plan view is formed from a material having a light shielding property. Here, as the material having a light shielding property, for example, a tape formed from aluminum that has a high noise-reduction effect and is not expensive or the like is preferably used. Accordingly, the driver IC 7 is covered with the shield member 80 having a light shielding property. Therefore, for example, incidence of light (external light) transmitted from the outside of the liquid crystal device 100 to the driver IC 7 can be prevented, whereby the malfunction of the driver IC 7 due to external light can be prevented.

In addition, according to such a configuration, since the insulating layer 82 of the shield member 80 is fixed to the driver IC 7 with an adhesive or an adhesive tape, the shield member 80 can be prevented from being detached from the driver IC 7.

Second Embodiment

Next, a noise elimination structure according to a second embodiment will be described with reference to FIG. 3.

Figure 3:
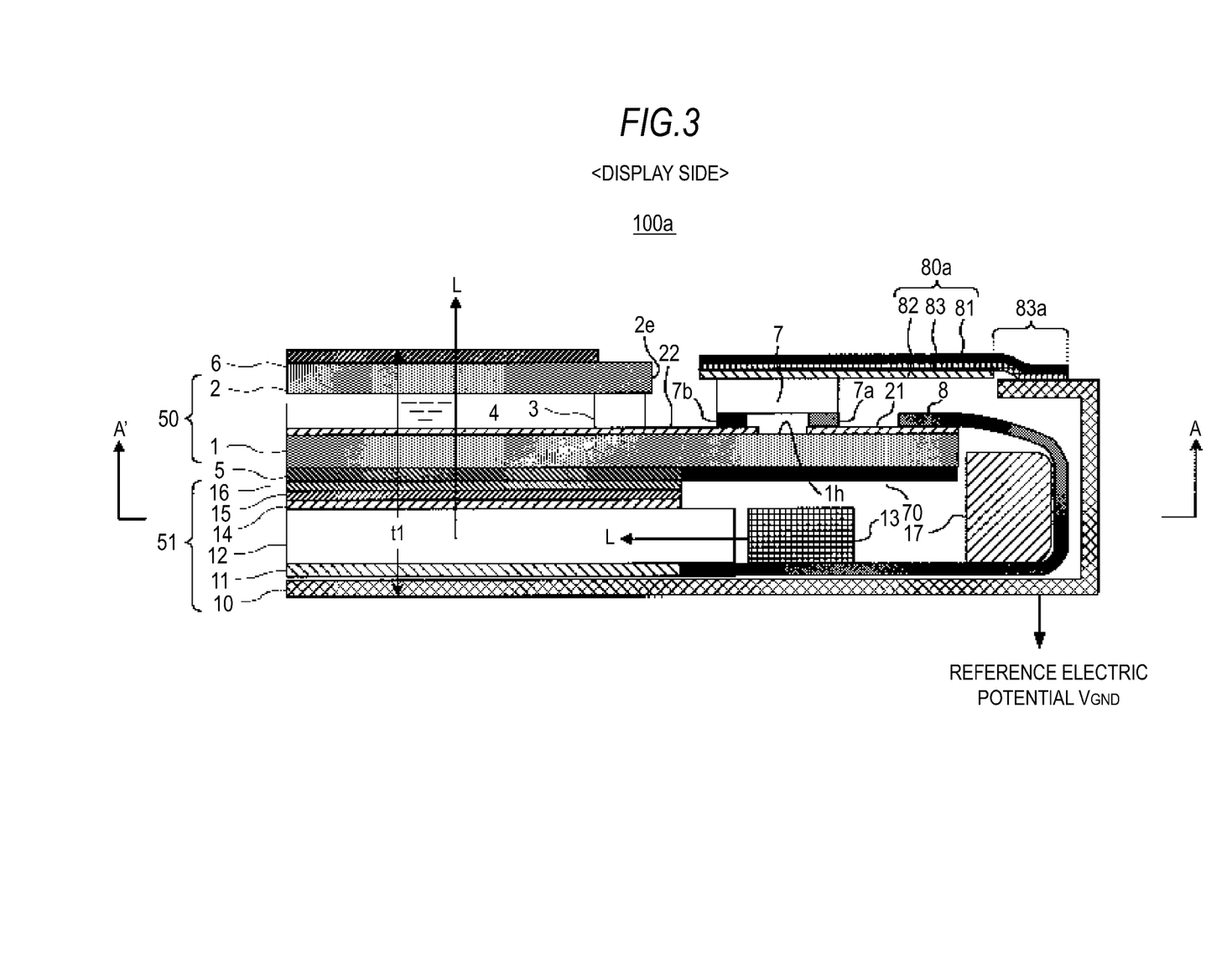
FIG. 3 is a cross-sectional view of a main portion of a liquid crystal device having the noise elimination structure according to a second embodiment.

FIG. 3 is a cross-sectional view of a main portion of a liquid crystal device 100a according to the second embodiment, which corresponds to that shown in FIG. 2. Particularly, FIG. 3 illustrates a noise elimination structure that is configured by a shield member 80a and the like.

In the liquid crystal device 100a according to the second embodiment, when being compared to the liquid crystal device 100 according to the first embodiment, noise is effectively eliminated by disposing a shield member, which is common. However, the structure of the shield member and the connection position, at which the shield member and the first support member 10 are connected to each other, are different from those of the first embodiment, and the other configurations are the same as those of the first embodiment. Thus, in the description below, the same reference sign is assigned to the same element as that of the first embodiment, and the description thereof is appropriately omitted.

Specifically, in the second embodiment, the shield member 80a is configured by a conductive layer 81, a conductive adhesion layer 83 that is arranged so as to overlap the conductive layer 81, and an insulating layer 82 that is arranged so as to partially overlap the conductive adhesion layer 83. Here, a conductive member having the conductive layer 81 and the conductive adhesion layer 83 arranged so as to overlap the conductive layer 81 is present. Thus, according to the second embodiment, there is an advantage that the shield member 80a can be easily manufactured by only arranging the conductive adhesion layer 83 of the above-described conductive member so as to partially overlap the insulating layer 82. A part 83a of the conductive adhesion layer 83 is exposed to the outside out of the insulating layer 82 and is electrically connected to the first support member 10 that is a conductive body electrically connected to the reference electric potential VGND, and the insulating layer 82 is fixed to the driver IC 7 with an adhesive or an adhesive tape not shown in the figure. Here, the reason for covering the driver IC 7 through the insulating layer 82 of the shield member 80a is because when the driver IC 7 is covered with being directly bonded to the conductive adhesion layer 83 of the shield member 80a, noise is input to the driver IC 7.

According to such a configuration, for example, when a high-frequency signal is input from the FPC 8 side to the driver IC 7 side through the connection terminal 21, and thus noise is emitted from the exposed portion of the connection terminal 21, or when noise is emitted from the driver IC 7 itself, the noise is led to the conductive adhesion layer 83 through the insulating layer 82 of the shield member 80a, is further led to the first support member 10 through the conductive adhesion layer 83, and finally is let out at the reference electric potential VGND. Accordingly, the noise that is generated by the liquid crystal device 100a can be effectively eliminated. Therefore, adverse effects due to the noise are prevented from being applied to the operation of the liquid crystal device 100a or the operation of the electronic apparatus in which the liquid crystal device 100a is mounted.

In addition, when noise is emitted from the outside of the liquid crystal device 100a toward the driver IC 7, the exposed portion of the connection terminal 21, the portion of the FPC 8 that is exposed from the first support member 10, and the like, the shield member 80a serves as a barrier, and the noise is prevented from being emitted thereto. The noise is led to the conductive adhesion layer 83 through the conductive layer 81 of the shield member 80a and further is let out at the reference electric potential VGND through the first support member 10. Accordingly, the noise generated outside the liquid crystal device 100a can be effectively eliminated. Therefore, the noise can be prevented from being applied to the driver IC 7, the exposed portion of the connection terminal 21, or the portion of the FPC 8 that is exposed from the first support member 10. As a result, a signal including noise is prevented from being applied to the driver IC 7, and a malfunction and the like of the driver IC 7 due to noise can be prevented.

In addition, since the shield member 80a is electrically connected to the reference electric potential VGND, electric charge generated due to noise can be prevented from being accumulated in the shield member 80a. Accordingly, the noise can be prevented from being emitted (secondary emission) from the shield member 80a.

In a preferred embodiment, in order to sufficiently bring out the operations and the advantages described above, the shield member 80a preferably has a size that can sufficiently cover the driver IC 7, the exposed portion of the connection terminal 21, and the portion of the FPC 8 exposed from the first support member 10. In addition, the planar shape of the shield member 80a may be the same as that of the shield member 80 according to the first embodiment as shown in FIG. 1.

In addition, in order not to change the external shape of the liquid crystal device 100a due to installation of the shield member 80a, it is preferable that the thickness of the shield member 80a does not exceed the thickness t1 of the liquid crystal device 100*a*. Recently, since the liquid crystal device 100*a* tends to be formed thinner and thinner, it is preferable that the shield member 80*a* is formed in a thin tape state.

In addition, according to the second embodiment, only one end side (that is, a part of the conductive adhesion layer 83 exposed to the outside by the insulating layer 82) of the shield member 80*a* may be connected to the first support member 10. Accordingly, the installation of the shield member 80*a* to the liquid crystal device 100*a* can be performed more easily than in the first embodiment.

In addition, it is preferable that at least an area of the conductive layer 81 of the shield member 80*a* that overlaps the driver IC 7 in the plan view is formed from a material having a light shielding property. Here, as the material having a light shielding property, for example, a tape formed from aluminum or the like that has a high noise-reduction effect and is inexpensive is preferably used. Accordingly, the driver IC 7 is covered with the shield member 80*a* having a light shielding property. Therefore, for example, incidence of light (external light) transmitted from the outside of the liquid crystal device 100*a* to the driver IC 7 can be prevented, whereby the malfunction of the driver IC 7 due to external light can be prevented.

In addition, according to such a configuration, since the insulating layer 82 of the shield member 80*a* is fixed to the driver IC 7 with an adhesive or an adhesive tape, the shield member 80*a* can be prevented from being detached from the driver IC 7.

Modified Examples

The present application is not limited to the configurations of the liquid crystal devices 100 and 100*a* according to the above-described embodiments, and may be changed in various forms in the scope not departing from the concept thereof.

For example, in the above-described first and second embodiments, it may be configured such that the end face of the shield member 80 or 80*a* that is positioned on the liquid crystal display panel 50 side further extends to the second substrate 2 side, and the exposed portion of the signal lines 22 extending from the output terminal 7*b* side of the driver IC 7 to the liquid crystal display panel 50 is be covered with the shield member 80 or 80*a*. In such a case, noise emitted from the outside of the liquid crystal device 100 and 100*a* can be prevented from being input to the signal lines 22, and accordingly, adverse effects due to the noise can be prevented from being applied to the operations of the liquid crystal devices 100 and 100*a*.

An embodiment is not limited to the configurations of the above-described shield members 80 and 80*a*, and various changes may be made in the configuration as long as the operations and the advantages described above can be acquired therefrom.

In addition, according to an embodiment, the entirety of the first support member 10 is not necessarily formed from a conductive body. For example, according to an embodiment, it may be configured such that at least only an area of the first support member 10 that can be electrically connected to the conductive adhesion layer 83 of the shield member 80 or 80*a* is formed as a conductive portion, and the conductive portion is electrically connected to the above-described reference electric potential VGND.

In addition, the shield member 80 or 80*a* may cover various electronic components mounted in the liquid crystal device 100 or 100*a* and terminals that are electrically connected to the electronic components and are exposed to the outside, in addition to the driver IC 7 and the FPC 8 as an example of a wiring substrate. In such a case, noise can be prevented from being applied to the electronic components and the terminals, or noise is prevented from being emitted from the electronic components and the terminals to the outside.

In addition, according to an embodiment, the insulating layer is not necessarily disposed in the shield member 80 or 80*a*. In the case of such a configuration, the shield member 80 or 80*a* may be configured so as to be fixed to the driver IC 7 through an insulating layer (an insulating tape of which both sides have adhesiveness) of a separate member.

Electronic Apparatus

Next, a specific example of an electronic apparatus having any liquid crystal device (hereinafter, representatively referred to as a "liquid crystal device 1000") out of the liquid crystal devices 100 and 100*a* according to the above-described embodiments and the liquid crystal devices according to the above-described modified examples will be described with reference to FIGS. 4A and 4B.

First, an example in which the liquid crystal device 1000 according to the embodiment of the application is applied to a display unit of a portable personal computer (a so-called notebook computer) will now be described. FIG. 4A is a perspective view showing the configuration of the personal computer. As shown in the figure, the personal computer 710 includes a main unit 712 having a keyboard 711 and a display unit 713 to which the liquid crystal device 1000 according to the embodiment is applied.

Subsequently, an example in which the liquid crystal device 1000 according to the embodiment is applied to a display unit of a cellular phone will now be described. FIG. 4B is a perspective view showing the configuration of the cellular phone. As shown in the figure, the cellular phone 720 includes a display unit 724 to which the liquid crystal device 1000 according to the embodiment is applied together with a plurality of operation buttons 721, an ear piece 722, and a mouthpiece 723.

Figure 4A:
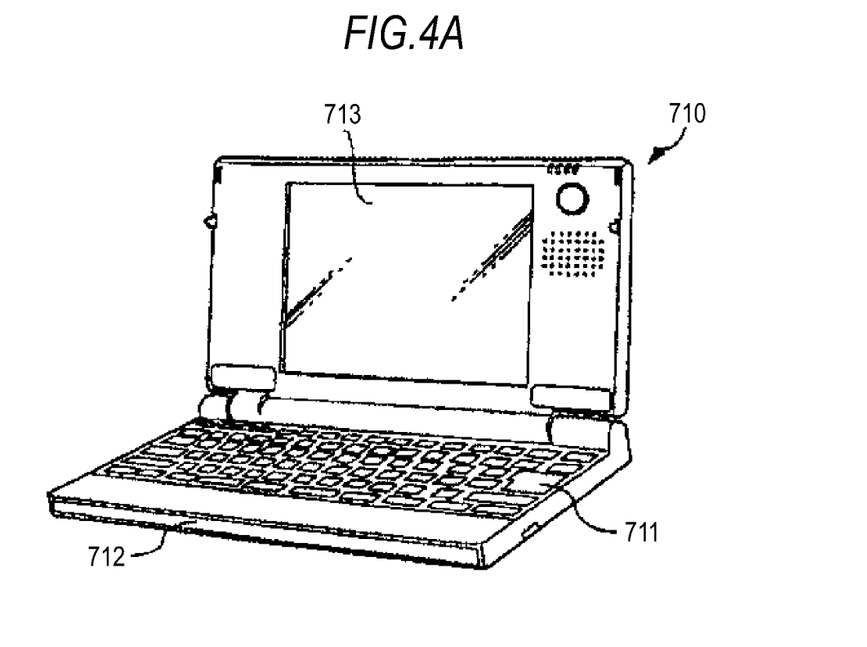
FIGS. 4A and 4B are perspective views of electronic apparatuses including a liquid crystal device according to an embodiment.
Figure 4B:
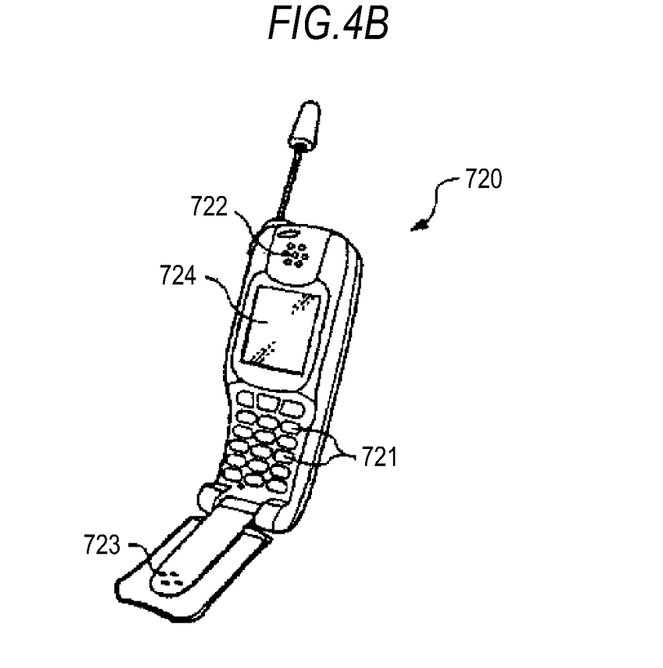

Examples of electronic apparatuses to which the liquid crystal device 1000 according to the embodiment can be applied include a liquid crystal TV set, a view-finder type or direct-view type video cassette recorder, a car navigation device, a pager, an electronic organizer, a calculator, a word processor, a workstation, a TV phone, a POS terminal, a digital still camera, and the like, in addition to the personal computer shown in FIG. 4A and the cellular phone shown in FIG. 4B.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An electro-optical device comprising:
   a frame that has a conductive portion;
   an electro-optical panel that is housed in the frame; and
   an electronic component that is mounted in a mounting area of the electro-optical panel,
   wherein a shield member having a conductive layer that covers at least a part of the mounting area is brought into contact with the electronic component through an insulating layer,
   wherein the conductive layer of the shield member is electrically connected to the conductive portion of the frame,
   wherein the shield member includes:
      the conductive layer;

a conductive adhesion layer that is arranged so as to overlap the conductive layer; and the insulating layer that is arranged so as to partially overlap the conductive adhesion layer;

wherein a part of the conductive adhesion layer is exposed out of the insulating layer and is electrically connected to the conductive portion of the frame, and wherein the insulating layer is fixed to the first electronic component.

2. The electro-optical device according to claim 1, wherein the conductive layer of the shield member is electrically connected to a reference electric potential.

3. The electro-optical device according to claim 1, wherein the electronic component includes a first electronic component and a second electronic component, wherein, in the mounting area, the first electronic component, the second electronic component, and a terminal that electrically connects the first electronic component and the second electronic component are arranged, and wherein the shield member covers the first electronic component and the terminal, and the second electronic component on a side which is electrically connected to the terminal.

4. The electro-optical device according to claim 3, wherein the shield member includes:

the conductive layer;

the insulating layer that is arranged so as to overlap the conductive layer; and a conductive adhesion layer that is arranged so as to overlap a part of the conductive layer, wherein the insulating layer of the shield member is fixed to the first electronic component, and wherein the conductive adhesion layer is electrically connected to the conductive portion of the frame.

5. The electro-optical device according to claim 3, wherein the first electronic component is a driver IC that controls a display state of the electro-optical panel, wherein the second electronic component is a wiring substrate, and wherein a high-frequency signal is input to the driver IC from a wiring substrate side through the terminal.

6. The electro-optical device according to claim 3, wherein at least an area, which overlaps the first electronic component in the plan view, of the shield member has a light shielding property.

7. An electronic apparatus comprising:

the electro-optical device according to claim 1, as a display unit.

* * * * *